US006639406B1

(12) United States Patent
Boskamp et al.

(10) Patent No.: US 6,639,406 B1
(45) Date of Patent: Oct. 28, 2003

(54) METHOD AND APPARATUS FOR DECOUPLING QUADRATURE PHASED ARRAY COILS

(75) Inventors: Eddy B. Boskamp, Menomonee Falls, WI (US); Ceylan Celil Guclu, Waukesha, WI (US); Ricardo Becerra, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/141,417

(22) Filed: May 8, 2002

(51) Int. Cl.$^7$ ................................................. G01V 3/00
(52) U.S. Cl. ........................................ 324/318; 324/322
(58) Field of Search ............................ 324/318, 322, 324/300, 306, 307, 309, 314

(56) References Cited

U.S. PATENT DOCUMENTS 4,833,429 A * 5/1989 Keren et al. ................. 333/156
4,885,541 A * 12/1989 Hayes ........................... 324/322
6,351,124 B1 * 2/2002 Vester et al. ................ 324/318

OTHER PUBLICATIONS

Roemer, Edelstein, Hayes and Mueller, "The NMR Phased Array," Magnetic Resonance In Medicine, vol. 16, pp. 192–225 (1990).

* cited by examiner

Primary Examiner—Louis Arana
(74) Attorney, Agent, or Firm—Fletcher Yoder

(57) ABSTRACT

A method and apparatus are disclosed for combining the respective readout signals for a loop and butterfly coil pair of a quadrature phased array used for magnetic resonance imaging. The technique used to combine the signals introduces a 180 degree phase shift, or multiple thereof, to the loop coil signal, thereby allowing the loop coil signal to be decoupled from other loop coil signals by a low input impedance preamplifier in series with the signal.

21 Claims, 3 Drawing Sheets

METHOD AND APPARATUS FOR DECOUPLING QUADRATURE PHASED ARRAY COILS

BACKGROUND OF THE INVENTION

The present invention relates generally to the field of signal amplification circuitry, such as circuitry used in medical diagnostic systems, and stability techniques used to enhance performance of such amplification circuitry. More particularly, the invention relates to the decoupling of receive coils to reduce crosstalk between signals originating in phased array and other coils.

Magnetic resonance imaging systems have found increasing applicability for a variety of imaging tasks, particularly in the medical field. Such systems typically include coil assemblies for generating rf magnetic fields used to control and excite spin systems in a subject of interest, such as in soft tissues of a patient. A body coil is typically employed for generating a highly uniform rf magnetic field transverse to the direction of the main, DC, magnetic field. A series of gradient coils generate spatially varying magnetic fields to select a portion of the subject to be imaged, and to spatially encode sensed signals emitted by unitary volumes within the selected slice. The gradient fields may be manipulated to orient the selected image slice, and to perform other useful imaging functions.

Sensing coils are employed in conventional MRI systems and are adapted to the particular type of image to be acquired. Such sensing coils are highly sensitive to emissions from the subject positioned within the primary and gradient fields. Such emissions, collected during data acquisition phases of imaging, serve to generate raw data signals which may be processed to extract information relating to the nature and location of different tissue types in the subject. Where the region to be imaged is relatively small, a single channel surface coil may be employed. For example, a linearly polarized shoulder coil is typically employed for producing images of a human shoulder. For larger images, large single coils may be employed, or multiple coils may be used, such as in "phased array" arrangements. However, the use of large surface coils tends to result in lower signal-to-noise ratios in the acquired image data. Phased array coil assemblies are, therefore, commonly employed to produce images of larger areas, while providing an acceptable signal-to-noise ratio.

In a typical phased array arrangement, several adjacent coils are provided for receiving the signals emitted by the spin systems of interest during the signal acquisition phase of imaging. In phased array coil systems, output signals from each of several adjacent coils are independently amplified by preamplifiers prior to processing of the signals for generation of the image data.

A problem arises in such systems from noise coupling, both between adjacent and non-adjacent receive coils in the array, that lowers the signal-to-noise ratio attained. Additionally, receive coil coupling can lead to artifact propagation. In particular, non-linearities between the homogeneous and gradient magnetic fields may produce an intense localized signal. If this intense signal is close to an active array element, the associated energy may be transferred to other elements of the array, thereby causing the artifact to propagate into the imaging volume. Both the general problem of noise coupling and the specific problem of artifact propagation can be eliminated by proper decoupling of the phased array receive coils during the receive period.

Adjacent coils may be geometrically decoupled by overlapping the coils. Due to the current-carrying paths established by each coil, such overlapping reduces or cancels mutual inductive coupling between the coils, thereby reducing noise coupling. For non-adjacent coils, preamplifier decoupling may be employed. Preamplifier decoupling turns one of the series capacitances of the coil into a parallel resonator network by applying a parallel inductor in series with a low input impedance preamplifier. The parallel resonator thus formed has high impedance, preventing current flow in the main body of the coil, and thereby providing zero mutual inductance with neighbors.

Decoupling is further complicated in the case of a quadrature phased array in which each element of the array is comprised a quadrature coil pair with orthogonally oriented rf magnetic fields. One common quadrature phased array element consists of a loop/butterfly pair in which the loop element is typically sensitive to fields perpendicular to the coil plane and the butterfly element is typically sensitive to fields parallel to the coil plane. Other quadrature coil pairs exist however. The quadrature phased arrays are sensitive to circularly polarized fields since one coil of the element is typically sensitive to fields perpendicular to the coil plane while the second coil is typically sensitive to fields parallel to the coil plane and the two coils are driven 90 degrees out of phase.

In the case of a loop/butterfly pair, adjacent quadrature coils are decoupled by geometric means, i.e. overlap. Non-adjacent butterflies do not need to be decoupled because the butterflies have a RF magnetic field that drops off quickly outside the coil region in the direction parallel to the main DC magnetic field, i.e. the Z-axis. The distance between non-adjacent butterfly loops therefore typically provides good signal isolation. The distance between non-adjacent loops, however, is typically insufficient to provide good signal isolation and, therefore, preamplifier decoupling is used to achieve signal isolation in conventional systems.

If the low input impedance preamplifier is not integrated into the coil, the readout signals from the loop/butterfly pair are sometimes combined by a 90 degree combiner which shifts one signal 90 degrees before adding it to the other signal before amplification. If a low input impedance preamplifier is applied in series with the output from the combiner, the preamplifier will provide decoupling for only one coil of the quadrature pair since the signal from the other coil is phase shifted by 90 degrees and therefore the low input impedance of the terminating preamplifier will look like an open circuit on the coil side of the combiner. The present invention addresses one or more of the problems discussed above.

SUMMARY OF THE INVENTION

The invention provides a novel technique for decoupling quadrature phased array elements for use in a magnetic resonance imaging system using low input impedance preamplifiers and combiners. The technique permits the loop and butterfly signals to be combined such that the loop signal is phase shifted 180 degrees, resulting in no impedance transformation. The combiner typically consists of four sections connected in a bridge configuration. Sufficient low impedance is maintained looking from the loop element through the combiner at the low input impedance preamplifier such that the decoupling functionality of the preamplifier is maintained for that loop element. Looking from the preamplifier through the combiner at the coil elements, 50Ω is maintained if both coil elements are matched to 50Ω such that noise figure of the preamplifier is minimized.

In accordance with one aspect of the present invention, a system is provided for decoupling receive coil signals. The system possesses a MR scanner including a receive coil assembly comprising quadrature coil pairs. The system also possesses a control and acquisition circuit connected to the scanner which comprises a coil control circuit and a data acquisition circuit. The system also possesses one or more system control circuits and an operator interface station.

In accordance with another aspect of the present invention, a system is provided for decoupling receive coil signals. The system possesses a phased array coil assembly comprising elements of butterfly and loop coils. The system also possesses a combiner connected to each element which receives a signal from the butterfly coil and the loop coil and which generates an output signal comprising a butterfly coil component shifted 90 degrees and a loop coil component shifted 180 degrees. The system also possesses a preamplifier connected to the combiner which receives the output signal.

In accordance with another aspect of the present invention, a combiner is provided for combining receive coil signals. The combiner comprises four sections which are the equivalent of one-quarter wavelength long transmission lines with different characteristic impedances which are connected in a bridge configuration in such a way that the combiner shifts one input signal by 90 degrees and a second input signal by 180 degrees.

In accordance with another aspect of the present invention, a combiner is provided for combining receive coil signals. The combiner comprises two equivalent inductances and two equivalent bridge capacitances connected as a loop with the two inductances disposed such that each inductance is adjacent to each bridge capacitance. Due to this configuration, a signal which enters the combiner at one corner and exits through the diametrically opposed corner traverses an inductance and a capacitance.

In accordance with another aspect of the present invention, a method is provided for combining receive coil signals. The method comprises transmitting a butterfly coil signal and a loop coil signal from the phased array coil assembly to a combiner which combines the two signals to form an output signal. The combiner combines the signals in such a way that the butterfly coil signal is phase shifted 90 degrees and the loop coil signal is phase shifted 180 degrees. The output signal is then processed in a low input impedance preamplifier to decouple loop coil signals.

In accordance with another aspect of the present invention, a system is provided for decoupling receive coil signals. The system includes a means for transmitting a butterfly coil signal and a loop coil signal from a phased array coil assembly to a combiner. The system also includes a means for combining the butterfly coil signal and the loop coil signal to produce an output signal in which the butterfly coil signal is phase shifted 90 degrees and the loop coil signal is phase shifted 180 degrees. The system also includes a means for processing the output signal such that the loop coil component is decoupled from other loop coil signals.

BRIEF DESCRIPTION OF THE DRAWINGS

The foregoing and other advantages and features of the invention will become apparent upon reading the following detailed description and upon reference to the drawings in which.

DETAILED DESCRIPTION OF THE INVENTION

Figure 1:
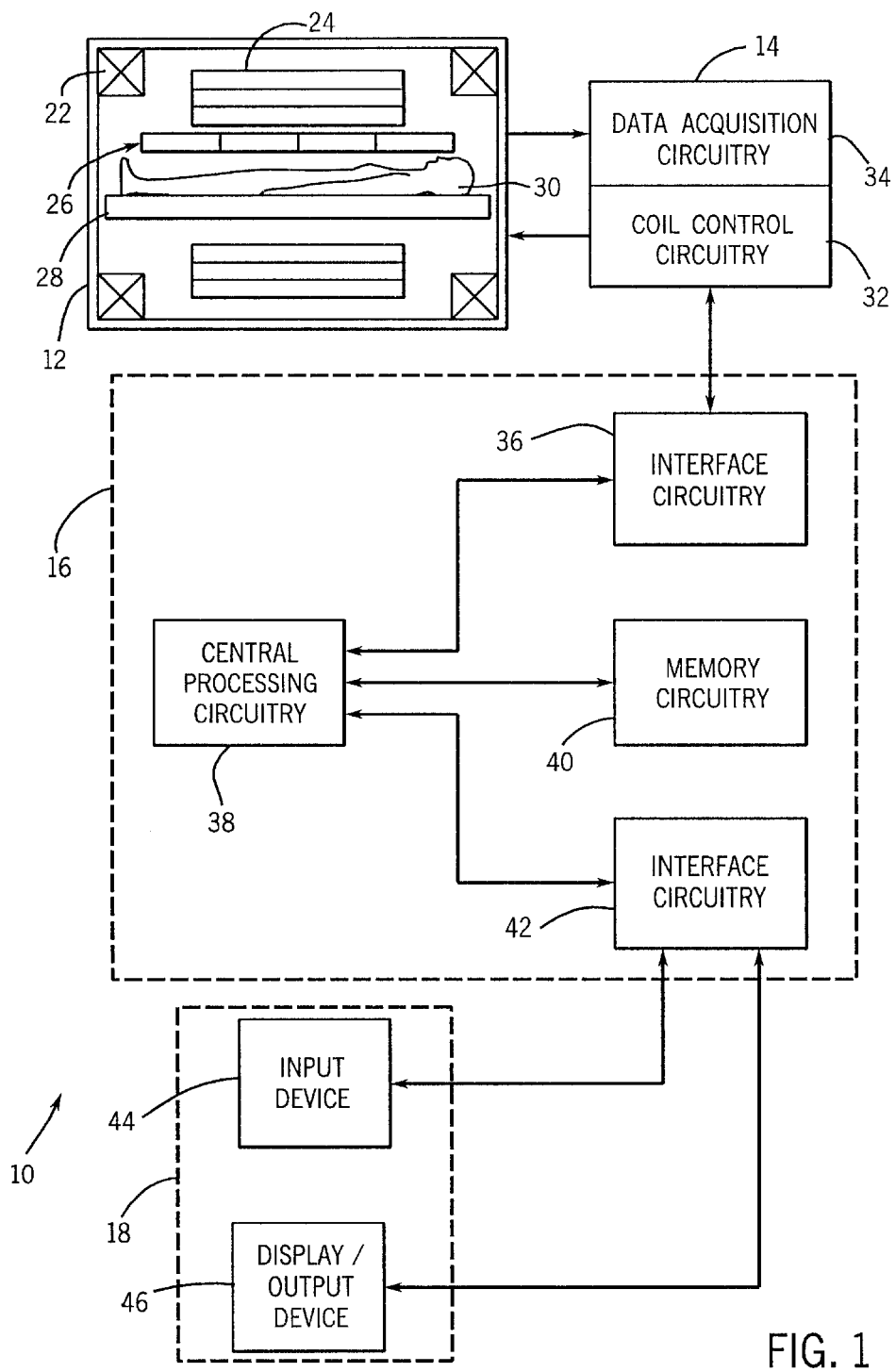
FIG. 1 is a diagrammatical representation of a magnetic resonance imaging system incorporating a multi-channel receiving coil for creating images of a subject of interest.

Referring now to FIG. 1, a magnetic resonance imaging system, designated generally by the reference numeral 10, is illustrated as including a scanner 12, control and acquisition circuitry 14, system controller circuitry 16, and an operator interface station 18. The scanner 12, in turn, includes coil assemblies for selectively generating controlled magnetic fields used to excite spin systems in a subject of interest. In particular, the scanner 12 includes a primary coil 22, which will typically include a superconducting magnet coupled to a cryogenic refrigeration system (not shown). The primary coil 22 generates a highly uniform magnetic field along a longitudinal axis of the scanner. A transmit coil assembly 24 consisting of a series of gradient coils and a rf body transmit coil is also provided for generating controllable magnetic fields having desired orientations with respect to the subject of interest. In particular, as will be appreciated by those skilled in the art, the transmit coil assembly 24 produces fields in response to pulsed signals for selecting an image slice, orienting the image slice, and encoding excited spin systems within the slice to produce the desired image.

A receiving coil assembly 26 is provided for detecting emissions from spin systems during data acquisition phases of operation of the system. A table 28 is positioned within the scanner 12 to support a subject 30. While a full body scanner is illustrated in the exemplary embodiment of FIG. 1, the technique described below may be equally well applied to various alternative configurations of systems and scanners, including smaller scanners, and scanners incorporating single channel, phased array and similar receiving coil structures. Moreover, the signal combining techniques described below may find application outside of the field of magnetic resonance imaging, and outside of the field of medical imaging in general.

In the embodiment illustrated in FIG. 1, the control and acquisition circuitry 14 includes coil control circuitry 32 and data acquisition circuitry 34. The coil control circuitry 32 receives pulse sequence descriptions from the system controller 16, notably through the interface circuitry 36 included in the system controller 16. As will be appreciated by those skilled in the art, such pulse sequence descriptions generally include digitized data defining pulses for exciting the transmit coil assembly 24 during excitation and data acquisition phases of imaging. Fields generated by the transmit coil assembly 24 excite the spin system within the subject 30 to cause emissions from the material. Such emissions are detected by a receiving coil assembly 26 and are filtered, amplified, and transmitted to data acquisition circuitry 34. Data acquisition circuitry 34 may perform preliminary processing of the detected signals, such as amplification of the signals. Following such processing, the amplified signals are transmitted to the interface circuitry 36 for further processing.

In addition to the interface circuitry 36, the system controller 16 includes central processing circuitry 38, memory circuitry 40, and interface circuitry 42 for communicating with the operator interface station 18. In general, the central processing circuitry 38, which will typically include a digital signal processor, a CPU or the like, as well as associated signal processing circuitry, commands excitation and data acquisition pulse sequences for the scanner 12 and the control and acquisition circuitry 14 through the intermediary of the interface circuitry 36. The central processing circuitry 38 also processes image data received via the interface circuitry 36, to perform 2D Fourier transforms to convert the acquired data from the time domain to the frequency domain, and to reconstruct the data into a meaningful image. The memory circuitry 40 serves to save such data, as well as pulse sequence descriptions, configuration parameters, and so forth. The interface circuitry 42 permits the system controller 16 to receive and transmit configuration parameters, image protocol and command instructions, and so forth.

The operator interface station 18 includes one or more input devices 44, along with one or more display or output devices 46. In a typical application, the input device 44 will include a conventional operator keyboard, or other operator input devices for selecting image types, image slice orientations, configuration parameters, and so forth. The display/output device 46 will typically include a computer monitor for displaying the operator selections, as well as for viewing scanned and reconstructed images. Such devices may also include printers or other peripherals for reproducing hard copies of the reconstructed images.

Figure 2:
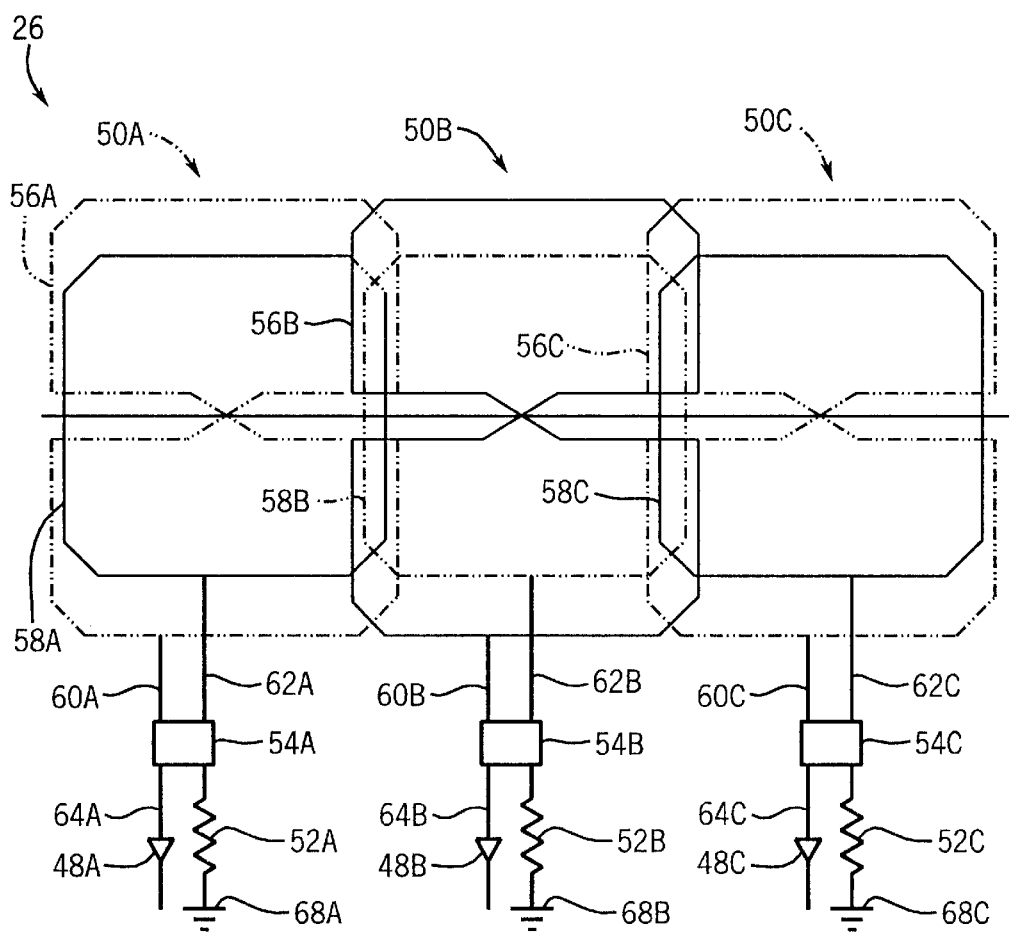
FIG. 2 is a diagrammatical representation of the multi-channel receiving coil of FIG. 1 and associated combiners and preamplifiers for processing signals received by the individual coils.

As shown in the diagrammatical representation of FIG. 2, the receiving coil assembly 26 of a quadrature phased array is composed of a number of array elements 50. In FIG. 2, three such elements, A, B and C, are depicted. Each array element is in turn comprised of a quadrature coil pair with orthogonal orientations of rf magnetic fields. The quadrature coil pairs are typically paired loop 58 and butterfly 56 receiving coils, with orthogonal orientations of RF magnetic fields. For the sake of simplicity, the following discussion assumes that the quadrature coil pairs are loop/butterfly pairs, though, as one skilled in the art will realize, other such pairs are possible and would benefit from the present invention.

As depicted in FIG. 2, the adjacent loop coils 58 overlap, allowing the mutual inductance of the loop coils 58 to be cancelled by, i.e. geometric decoupling. Likewise, the adjacent butterfly coils 56 overlap and are geometrically decoupled. The non-adjacent loop coils 58, i.e. 58A and 58C, are decoupled by means of the preamplifiers 48.

Each array element 50 is coupled to a combiner 54 and a low input impedance preamplifier 48 for combining and enhancing signals detected by the receiving coils 56 and 58. The loop coil 58 and butterfly coil 56 may be coupled to the combiner 54 directly or by means of coaxial cables 62, 60 respectively. Similarly, butterfly coil 56 may be coupled to the combiner 54 directly or by means of a butterfly coaxial cable 60. The combiner 54 is coupled to the preamplifier 48 directly or by means of a preamplifier coaxial cable 64. If the combiner 54 is not coupled directly to either of the loop coil 58 or preamplifier 48, the sum of the length of the coaxial cables 62 and 64 should be chosen such that the total phase shift through the combiner and cables 62, 64 is an integer multiple of 180 degrees. For example the integer multiple would be 1 in the event that the loop coil 58, combiner 54 and preamplifier 48 are all directly connected, eliminating the need for coaxial cables 62, 64. However if the combiner 54 is not directly connected to loop coil 58 or preamplifier 48 but is instead connected via coaxial cable 62 or 64, the sum of the lengths of coaxial cables 62 and 64 must introduce some integer multiple of 180 degrees of phase shift to the loop coil signal in addition to the phase shift introduced by combiner 54. Similarly, the sum of the phase shifts of coax cables 60 and 64, if present, should also be n*180 degrees to maintain the 90 degree phase introduced into the butterfly coil signal by combiner 54. In addition, an isoport resistor 52 is coupled from the remaining combiner port to ground.

Figure 3:
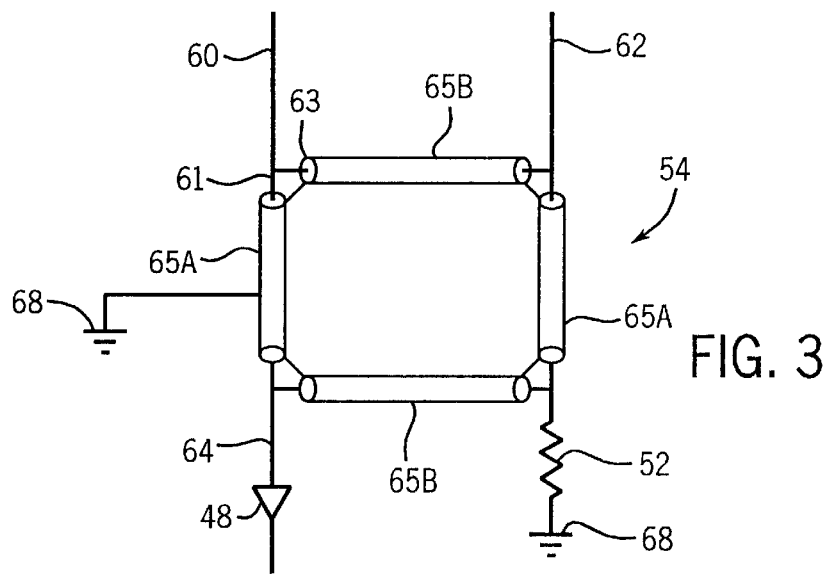
FIG. 3 is a diagrammatical representation of a combiner of the type included in FIG. 2 with transmission lines.

FIG. 3 illustrates an embodiment of the present technique using a combiner 54 with transmission lines. The combiner 54 is comprised of four sections 65, which are the equivalent of one-quarter wavelength ($\lambda/4$) long transmission lines with different characteristic impedances which are connected in a bridge configuration. The sections 65 are each comprised of an inner conductor 61, which carries the respective signals, and a shield layer 63, which shields the conductor 61. The shield layers 63 associated with each section 65 are typically at ground potential due to connection to a grounded part 68. Typically the sections 65 are portions of coaxial cable. An isoport resistor 52 is connected from the combiner 54 to ground and serves to dissipate any reflected power resulting from connection mismatches. The isoport resistor 52 typically provides a 50$\Omega$ resistance.

Two of the sections 65 are throughput sections 65A which run between the signal inputs and signal outputs. The remaining two sections 65 are bridge sections 65B which bridge together the throughout sections 65A. The throughput sections 65A typically have a characteristic impedance (Z) of 35$\Omega$, i.e. $50/\sqrt{2}$, while Z=50$\Omega$ for the bridge sections 65B. The respective impedances provide a 50$\Omega$ impedance looking toward the coils 56, 58 from the preamplifier 48 when coils 56 and 58 are properly matched to 50 ohms. This minimizes the noise figure of the preamplifier. When present, each coaxial cable 60, 62 is typically connected to the combiner 54 by means of a balun (not shown) which makes the cables positioning insensitive but is otherwise unimportant to the present technique. The signal from loop coil 58 is input into the combiner 54, either via loop coaxial cable 62 or directly, so that the incoming signal must traverse a bridge section 65B and a throughput section 65A in order to reach the preamplifier 48, possibly via coaxial cable 64. As noted above, if coaxial cables are employed, the sum of the length of the coaxial cables in the signal path should impart a phase difference of 180 degrees, or some integer multiple thereof, to the signal in order to preserve the effects of the combiner.

The butterfly coaxial cable 60, is connected to the combiner 54, either directly or via coaxial cable 60, so that the butterfly coil signal only traverses a throughput section 65A to reach the output port to the preamplifier 48. The butterfly coil signal is therefore phase shifted 90 degrees, i.e. $\lambda/4$, and cannot be electrically decoupled by the preamplifier 48. However, preamplifier decoupling of the non-adjacent butterfly coil signals is unnecessary since these signals are instead decoupled by the rapid falloff of the RF signal along the longitudinal axis of the coil assembly 26. As with the loop coil signal, if coaxial cables are employed in the path of the butterfly coil signal, the sum of the length of the coaxial cables in the signal path should impart a phase difference of 180 degrees, or some integer multiple thereof, to the signal in order to preserve the effects of the combiner.

Looking from the loop coil through the combiner at the preamplifier a low impedance, typically 2$\Omega$ is seen while a different impedance, typically 50$\Omega$, is seen looking from the preamplifier to the combiner at either of the two coils which are properly matched to 50 ohms. The result is that a low input impedance is seen looking from the loop coil 58, which is necessary for successful preamplifier decoupling. A high impedance, however, is seen looking from the butterfly coil 56 at the preamplifier, due to the 90 degree phase shift.

Figure 4:
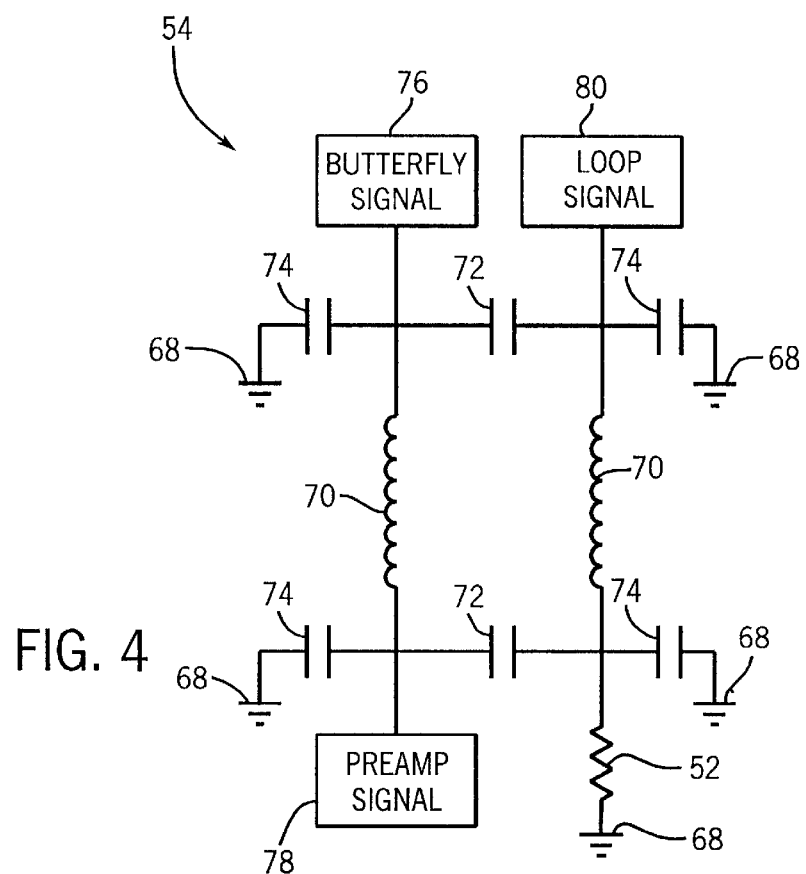
FIG. 4 is a schematic representation of a combiner circuit with lumped elements.

FIG. 4 depicts a sample circuit embodying the present technique. The represented sample circuit depicts a combiner 54 with lumped elements. As depicted, the sample circuit may consist of an inductance 70, L, between the butterfly signal 76 and the preamplifier signal 78 and another inductance 70 between the loop signal 80 and the isoport resistor 52. Two bridge capacitances 72, $C_1$, span the region between the two inductances 70, one upstream and one downstream. Similarly, a ground capacitance 74, $C_2$, exists both upstream and downstream of each inductance 70 between the inductance 70 and a ground element 68. In FIG. 4, the capacitances 72, 74 and the inductances 70 replace the coaxial cable segments 65 associated with the transmission line embodiment discussed above.

In a preferred embodiment, the inductance 70, in Henrys, and the capacitances 72, 74, measured in Farads, are defined by the equations:

$$L = \frac{50}{\omega\sqrt{2}} H \quad (1)$$

$$C_1 = \frac{1}{\omega 50} F \quad (2)$$

$$C_2 = \frac{\sqrt{2}-1}{\omega 50} F \quad (3)$$

in which ω represents the radial frequency, 2πf. Similar to the previously described embodiment, the traversal of the loop signal 80 through bridge capacitance 72 and inductance 70 provides a 180 degree phase shift of the loop signal 80. Likewise, the traversal of the butterfly signal 76 through only the inductance 70 introduces a 90 degree phase shift in that signal. Due to this phase shift of 180 degrees, the loop signal 80 is decoupled by the preamplifier 48, which has a low input impedance. By this technique, decoupling of the loop signal 80 by the preamplifier 48 can be achieved along with the combination of loop and butterfly signal 80, 76 into a single preamplifier signal 78.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for decoupling receive coil signals in a magnetic resonance imaging system, the system comprising:
    a magnetic resonance scanner comprising:
        a primary coil;
        one or more gradient coils;
        a quadrature phased array receive coil assembly comprising one or more receive coil elements wherein each element comprises:
            a quadrature coil pair;
            a combiner circuit connected to the quadrature coil pair such that the combiner circuit receives a first signal from a first member of the quadrature pair and a second signal from a second member of the quadrature pair wherein the combiner phase shifts the first signal by 90 degrees and the second signal by 180 degrees and combines the first signal and the second signal to produce a combined signal;
            a preamplifier connected to the combiner circuit which processes the combined signal such that a component of the combined signal attributable to the second signal is decoupled from one or more other signals produced by the second members of other receive coil elements;
    a control and acquisition circuit operatively connected to the magnetic resonance scanner;
    one or more system controller circuits operatively connected to the control and acquisition circuit; and
    an operator interface station operatively connected to the one or more system control circuits.

2. The system of claim 1, wherein the first member is a butterfly coil and the second member is a loop coil.

3. The system of claim 1, wherein the combiner circuit comprises four sections connected in a bridge configuration wherein the sections are equivalent to one-quarter wavelength long transmission lines.

4. The system of claim 3, wherein the four sections have different characteristic impedances.

5. The system of claim 4, wherein two opposing transmission line sections have a characteristic impedance of approximately 50Ω and the remaining two opposing transmission line sections have a characteristic impedance of approximately 35Ω.

6. The system of claim 1, wherein an isoport resistor is connected from the combiner to ground.

7. The system of claim 1, wherein the combiner circuit comprises two equivalent inductances and two equivalent bridge capacitances disposed as a loop such that each inductance is adjacent to the two bridge capacitances.

8. The system of claim 6, wherein the inductances equal 50/(ω√2) H and the bridge capacitances equal 1/ω50 F.

9. The system of claim 8, wherein the combiner circuit further comprises four equivalent ground capacitances disposed such that a ground capacitance is connected in series between each end of the impedances and a grounded region.

10. The system of claim 9, wherein the ground capacitance equal (√2−1)/ω50 F.

11. A system for decoupling receive coil signals in a phased array coil assembly, the system comprising:
    a phased array coil assembly comprising one or more receive coil elements wherein each element comprises a butterfly coil and a loop coil;
    a combiner connected to each element such that the combiner receives a butterfly coil signal and a loop coil signal and generates an output signal comprising a butterfly coil component shifted 90 degrees and a loop coil component shifted 180 degrees; and
    a preamplifier connected to the combiner such that the preamplifier receives the output signal and decouples the loop coil component from one or more other loop coil components generated by other receive coil elements.

12. The system of claim 11, wherein the combiner circuit comprises four sections connected in a bridge configuration wherein the sections are the equivalent of one-quarter wavelength long transmission lines.

13. The system of claim 12, wherein the combiner circuit has a uniform impedance of 50Ω when properly terminated with 50Ω.

14. The system of claim 12, wherein two opposing transmission line sections have a characteristic impedance of approximately 50Ω and the remaining two opposing sections have a characteristic impedance of approximately 35Ω.

15. The system of claim 11, wherein a grounded isoport resistor is connected to the combiner.

16. The system of claim 11, wherein the combiner circuit comprises two equivalent inductances and two equivalent bridge capacitances disposed as a loop such that each inductance is adjacent to the two bridge capacitances.

17. The system of claim 16, wherein the inductances equal $50/(\omega\sqrt{2})$ H and the bridge capacitances equal $1/\omega 50$ F.

18. The system of claim 17, wherein the combiner circuit further comprises four equivalent ground capacitances disposed such that a ground capacitance is connected serially-between each end of the inductances and a ground region.

19. The system of claim 18, wherein the ground capacitance equals $(\sqrt{2}-1)/\omega 50$ F.

20. The system of claim 11, wherein the combiner produces the combined signal by adding the butterfly coil signal and the loop coil signal.

21. A system for decoupling receive coil signals in a phased array coil assembly, the system comprising:

means for transmitting a butterfly coil signal and a loop coil signal from the phased array coil assembly to a combiner;

means for combining the butterfly coil signal and the loop coil signal to produce an output signal in which the butterfly coil signal is phase shifted 90 degrees and the loop coil signal is phase shifted 180 degrees;

means for processing the output signal such that a component of the output signal attributable to the loop coil signal is decoupled from one or more other loop coil signals.

* * * * *